(12) United States Patent
Sato et al.

(10) Patent No.: US 8,658,522 B2
(45) Date of Patent: *Feb. 25, 2014

(54) METHODS AND APPARATUS FOR INCORPORATING NITROGEN IN OXIDE FILMS

(71) Applicant: Applied Materials, Inc., Santa Clara, CA (US)

(72) Inventors: Tatsuya Sato, Cupertino, CA (US); Patricia M. Liu, Saratoga, CA (US); Fanos Christodoulou, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/759,020

(22) Filed: Feb. 4, 2013

(65) Prior Publication Data

US 2013/0149468 A1    Jun. 13, 2013

Related U.S. Application Data

(63) Continuation of application No. 13/072,177, filed on Mar. 25, 2011, now Pat. No. 8,375,892, which is a continuation of application No. 11/493,193, filed on Jul. 25, 2006, now Pat. No. 7,913,645, which is a continuation of application No. 11/446,444, filed on Jun. 2, 2006, now Pat. No. 7,902,050.

(60) Provisional application No. 60/687,096, filed on Jun. 2, 2005.

(51) Int. Cl.
*H01L 21/26* (2006.01)
*H01L 21/42* (2006.01)

(52) U.S. Cl.
USPC ........... 438/513; 438/485; 438/520; 438/528; 257/E21.311

(58) Field of Classification Search
USPC .................. 438/485, 513, 520, 528; 29/25.01; 118/723 R, 723 E; 257/E21.311
See application file for complete search history.

(56) References Cited

U.S. PATENT DOCUMENTS

| 6,068,729 A | 5/2000 | Shrotriya |
| 6,432,255 B1 | 8/2002 | Sun et al. |
| 6,626,188 B2 | 9/2003 | Fitzsimmons et al. |

(Continued)

FOREIGN PATENT DOCUMENTS

| JP | 02-215126 | 8/1990 |
| JP | 04-354330 | 12/1992 |

(Continued)

OTHER PUBLICATIONS

ISR & WO of International Application No. PCT/US2006/021498 mailed on Jan. 22, 2007.

(Continued)

*Primary Examiner* — Michelle Mandala
(74) *Attorney, Agent, or Firm* — Dugan & Dugan, PC

(57) ABSTRACT

In a first aspect, a first method is provided. The first method includes the steps of (1) preconditioning a process chamber with an aggressive plasma; (2) loading a substrate into the process chamber; and (3) performing plasma nitridation on the substrate within the process chamber. The process chamber is preconditioned using a plasma power that is at least 150% higher than a plasma power used during plasma nitridation of the substrate. Numerous other aspects are provided.

24 Claims, 6 Drawing Sheets

(56) References Cited

U.S. PATENT DOCUMENTS

| | | |
|---|---|---|
| 2002/0006736 A1 | 1/2002 | Moore |
| 2002/0110700 A1 | 8/2002 | Hein et al. |
| 2002/0168847 A1 | 11/2002 | Narwankar et al. |
| 2003/0066487 A1 | 4/2003 | Suzuki |
| 2005/0196954 A1 | 9/2005 | Noguchi |
| 2007/0111458 A1 | 5/2007 | Sato |
| 2007/0141856 A1 | 6/2007 | Sato et al. |
| 2011/0168093 A1 | 7/2011 | Sato et al. |

FOREIGN PATENT DOCUMENTS

| | | |
|---|---|---|
| JP | 08-097157 | 4/1996 |
| JP | 11-016845 | 1/1999 |
| JP | 2000-323475 | 11/2000 |
| JP | 2005-045075 | 2/2005 |
| JP | 2006-005287 | 1/2006 |
| JP | 2001-127068 | 5/2011 |
| WO | WO 99/03312 | 1/1999 |
| WO | WO 00/22664 | 4/2000 |
| WO | WO 01/32782 | 5/2001 |
| WO | WO 2006/130838 | 7/2006 |

OTHER PUBLICATIONS

IPRP of International Application No. PCT/US2006/021498 mailed on Dec. 21, 2007.
Office Action of U.S. Appl. No. 11/446,444 Mailed Jun. 25, 2009.
Sep. 25, 2009 Response to Office Action of U.S. Appl. No. 11/446,444 Mailed Jun. 25, 2009.
Office Action of U.S. Appl. No. 11/493,193 Mailed Oct. 28, 2009.
Office Action of U.S. Appl. No. 11/446,444 Mailed Dec. 16, 2009.
Jan. 28, 2010 Response to Office Action of U.S. Appl. No. 11/493,193 Mailed Oct. 28, 2009.
Mar. 16, 2010 Response to Office Action of U.S. Appl. No. 11/446,444 Mailed Dec. 16, 2009.
Office Action of U.S. Appl. No. 11/493,193 Mailed May 13, 2010.
Office Action of U.S. Appl. No. 11/446,444 Mailed May 17, 2010.
Interview Summary of U.S. Appl. No. 11/446,444, filed Jul. 20, 2010.
Interview Summary of U.S. Appl. No. 11/446,444, filed Jul. 20, 2009.
Interview Summary of U.S. Appl. No. 11/446,444, filed Mar. 16, 2010.
Aug. 12, 2010 Response to Office Action of U.S. Appl. No. 11/493,193 Mailed May 13, 2010.
Aug. 17, 2010 Response to Office Action of U.S. Appl. No. 11/446,444 Mailed May 17, 2010.
Notice of Allowance of U.S. Appl. No. 11/493,193 Mailed Oct. 21, 2010.
Notice of Allowance of U.S. Appl. No. 11/446,444 Mailed Oct. 27, 2010.
Preliminary Amendment of U.S. Appl. No. 13/072,177, filed May 25, 2011.
Office Action of U.S. Appl. No. 13/072,177 mailed Jun. 18, 2012.
Sep. 18, 2012 Response to Office Action and Terminal Disclaimer of U.S. Appl. No. 13/072,177.
Notice of Allowance of U.S. Appl. No. 13/072,177 mailed Oct. 19, 2012.

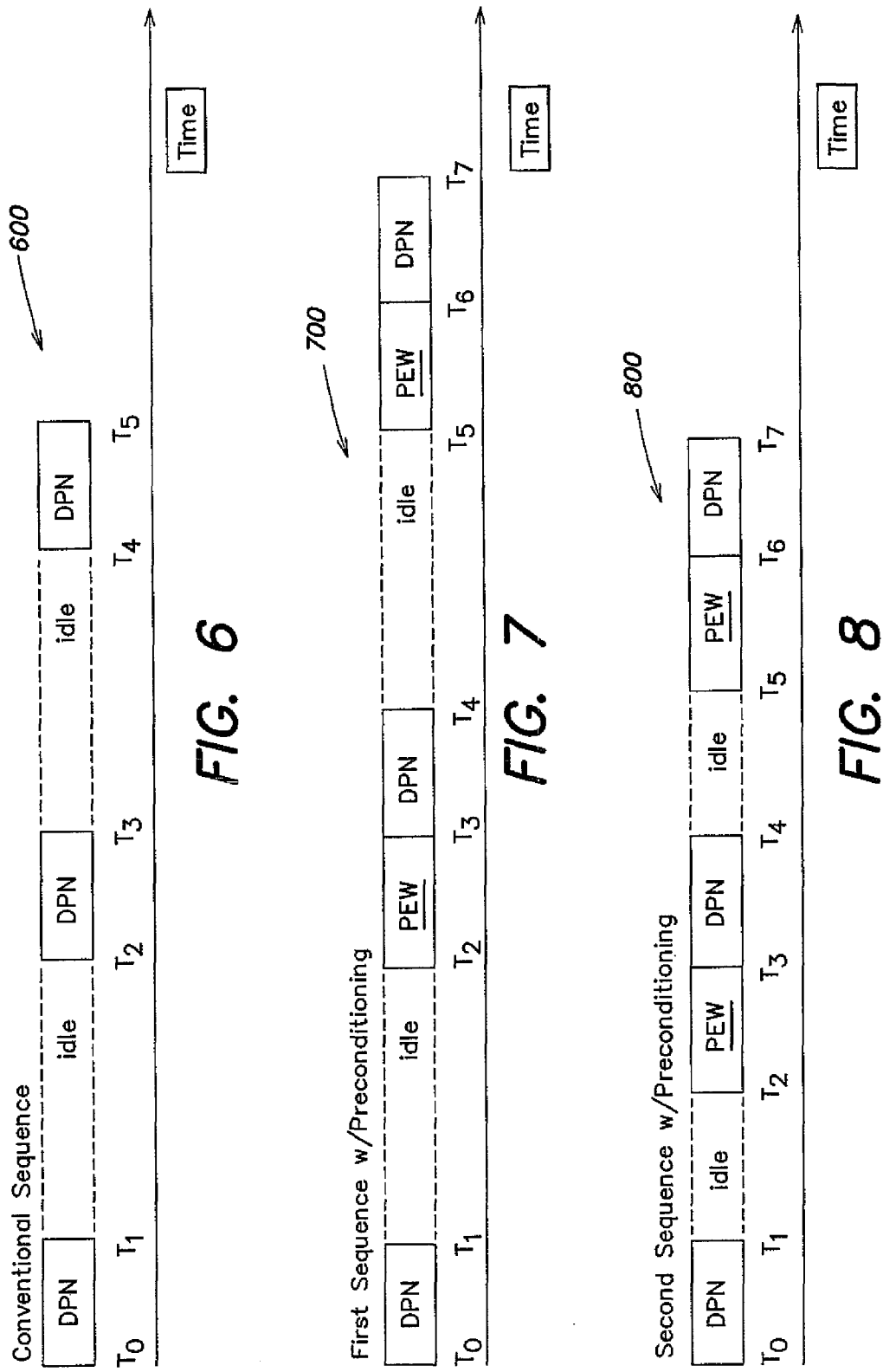

METHODS AND APPARATUS FOR INCORPORATING NITROGEN IN OXIDE FILMS

This is a continuation of, and claims priority to, U.S. patent application Ser. No. 13/072,177, "METHODS AND APPARATUS FOR INCORPORATING NITROGEN IN OXIDE FILMS," filed Mar. 25, 2011, now U.S. Pat. No. 8,375,892, which is a continuation of, and claims priority to, U.S. patent application Ser. No. 11/493,193, "METHODS AND APPARATUS FOR INCORPORATING NITROGEN IN OXIDE FILMS," filed Jul. 25, 2006, now U.S. Pat. No. 7,913,645, which is a continuation of, and claims priority to, U.S. patent application Ser. No. 11/446,444, "METHODS AND APPARATUS FOR INCORPORATING NITROGEN IN OXIDE FILMS," filed Jun. 2, 2006, now U.S. Pat. No. 7,902,050, which claims priority to U.S. Provisional Patent Application No. 60/687,096, "METHODS AND APPARATUS FOR INCORPORATING NITROGEN IN OXIDE FILMS," filed Jun. 2, 2005. Each of these applications is hereby incorporated by reference herein in its entirety for all purposes.

FIELD OF THE INVENTION

The present invention relates to semiconductor device processing and more specifically to methods and apparatus for incorporating nitrogen in oxide films.

BACKGROUND OF THE INVENTION

The drive for higher performance, higher density electronics has lead to continual scaling of the lateral dimensions of metal-oxide-semiconductor (MOS) devices. As lateral device dimensions are reduced, a MOS device's gate dielectric thickness (e.g., silicon dioxide thickness) also must be reduced to maintain sufficient charge storage capacity for proper operation of the MOS device.

Modern lateral device dimension requirements have forced gate dielectrics into the sub-40 angstrom regime without a proportional decrease in drive voltage. The combination of thinner gate dielectric layers with the same or similar drive voltages has lead to increased device electric fields for each successive MOS device generation. Accordingly, hot-carrier damage associated with these increased electric fields and dielectric breakdown strength have become major concerns with regard to further scaling of MOS devices. Additionally, reduced MOS device dimensionality has led to extensive use of fabrication techniques such as e-beam lithography and reactive ion etching which employ energetic particles and produce ionizing radiation that can damage conventional furnace grown silicon dioxide ($SiO_2$) gate dielectrics.

An alternative to the use of "pure" silicon dioxide as a gate dielectric is the use of "nitrided oxides" or "oxynitrides". An oxynitride typically incorporates a small amount (e.g., 1-5 atomic percent) of nitrogen at the $Si/SiO_2$ interface. The interfacial nitrogen improves the hot-carrier and radiation damage resistance of oxynitrides, and enhances the oxynitride's barrier diffusion properties. Nitrogen in the bulk of the oxide layer increases the dielectric constant of the oxide layer.

One technique that may be used to introduce nitrogen to silicon dioxide is plasma nitridation. In plasma nitridation, an RF plasma reactor is employed to incorporate nitrogen into an oxide film. For example, an RF plasma may be employed to dissociate molecular nitrogen into atomic (and/or ionic) nitrogen, and the atomic and/or ionic nitrogen then may be incorporated into the oxide film. The plasma generally is employed without applying bias power. That is, the nitrogen plasma is primarily created through pulsed or continuous source (coil) power.

Following conventional plasma nitridation, similarly processed substrates may exhibit varying oxide thicknesses and/or nitrogen incorporation levels. Such varying oxide thicknesses and/or nitrogen incorporation levels may lead to undesirable device-to-device variations that affect device yield and cost. As such, improved methods and apparatus for incorporating nitrogen in oxide films are desirable.

SUMMARY OF THE INVENTION

In a first aspect of the invention, a first method is provided. The first method includes the steps of (1) preconditioning a process chamber with an aggressive plasma; (2) loading a substrate into the process chamber; and (3) performing plasma nitridation on the substrate within the process chamber. The process chamber is preconditioned using a plasma power that is at least 150% higher than a plasma power used during plasma nitridation of the substrate.

In a second aspect of the invention, a second method is provided. The second method includes the steps of (1) preconditioning a process chamber with a first aggressive nitrogen plasma; (2) loading a first substrate into the process chamber; and (3) performing plasma nitridation on the first substrate. The process chamber is preconditioned with the first aggressive nitrogen plasma using a plasma power that is at least 150% higher than a plasma power used during plasma nitridation of the first substrate. The second method also includes the steps of (4) preconditioning the process chamber with a second aggressive nitrogen plasma; (5) loading a second substrate into the process chamber; and (6) performing plasma nitridation on the second substrate. The process chamber is preconditioned with the second aggressive nitrogen plasma using a plasma power that is at least 150% higher than a plasma power used during plasma nitridation of the second substrate.

In a third aspect of the invention, a third method is provided. The third method includes the steps of (1) preconditioning a process chamber with an aggressive plasma so as to cause nitrogen to be absorbed or adsorbed onto at least one of process kit parts and chamber walls of the process chamber; (2) loading a substrate into the process chamber; and (3) performing plasma nitridation on the substrate within the process chamber.

In a fourth aspect of the invention, a first apparatus is provided. The first apparatus includes (1) a process chamber; and (2) a controller coupled to the process chamber. The controller is configured to control the process chamber so as to (a) precondition the process chamber with an aggressive plasma; (b) load a substrate into the process chamber; and (c) perform plasma nitridation on the substrate within the process chamber. The process chamber is preconditioned using a plasma power that is at least 150% higher than a plasma power used during plasma nitridation of the substrate.

In a fifth aspect of the invention, a second apparatus is provided. The second apparatus includes (1) a process chamber; and (2) a controller coupled to the process chamber. The controller is configured to control the process chamber so as to (a) precondition the process chamber with a first aggressive nitrogen plasma; (b) load a first substrate into the process chamber; and (c) perform plasma nitridation on the first substrate. The process chamber is preconditioned with the first aggressive nitrogen plasma using a plasma power that is at least 150% higher than a plasma power used during plasma nitridation of the first substrate. The controller is further configured to control the process chamber so as to (d) preconditioning the process chamber with a second aggressive nitrogen plasma; (e) load a second substrate into the process chamber; and (f) perform plasma nitridation on the second substrate. The process chamber is preconditioned with the second aggressive nitrogen plasma using a plasma power that is at least 150% higher than a plasma power used during plasma nitridation of the second substrate.

In a sixth aspect of the invention, a third apparatus is provided. The third apparatus includes (1) a process chamber; and (2) a controller coupled to the process chamber. The controller is configured to control the process chamber so as to (a) precondition the process chamber with an aggressive plasma so as to cause nitrogen to be absorbed or adsorbed onto at least one of process kit parts and chamber walls of the process chamber; (b) load a substrate into the process chamber; and (c) perform plasma nitridation on the substrate within the process chamber. Numerous other aspects are provided.

Other features and aspects of the present invention will become more fully apparent from the following detailed description, the appended claims and the accompanying drawings.

BRIEF DESCRIPTION OF THE DRAWINGS

FIG. 6 is a timeline of a conventional nitridation process sequence for a plasma nitridation chamber.

FIG. 7 is a timeline of a first exemplary nitridation process sequence for a plasma nitridation chamber provided in accordance with the present invention.

FIG. 8 is a timeline of a second exemplary nitridation process sequence for a plasma nitridation chamber provided in accordance with the present invention.

DETAILED DESCRIPTION

Figure 1:
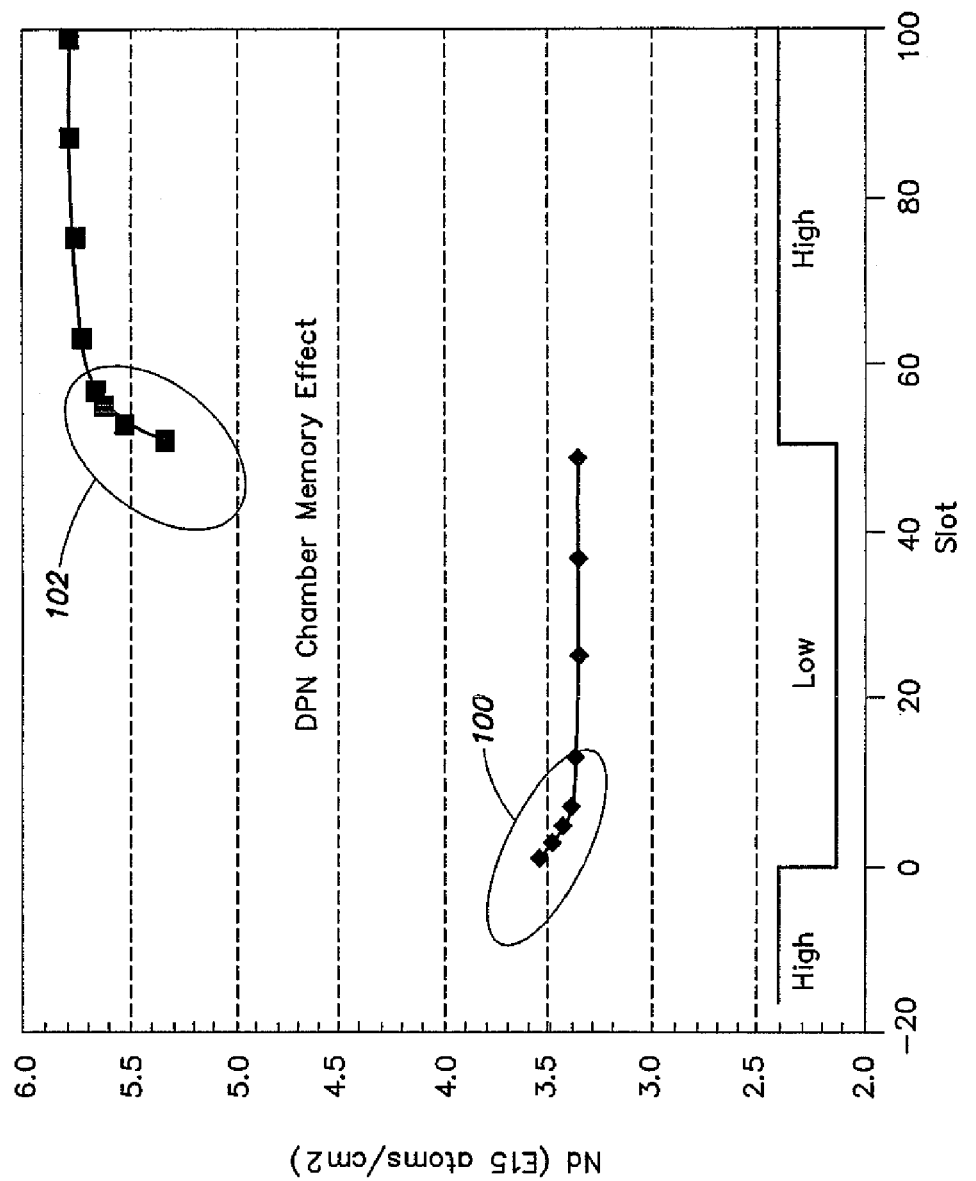
FIG. 1 is a graph of Ndose versus wafer number (slot number) in a 300 mm DPN chamber in accordance with the present invention.

The present invention provides improved methods and apparatus for increasing the density of nitrogen that may be incorporated into an oxide film formed on a substrate. In accordance with the invention, a plasma reactor may be used, for example, to incorporate nitrogen into a gate oxide or other material layer.

The present invention also provides methods and apparatus for forming a thinner layer of nitrided oxide than that which may be formed using conventional processes. For example, through use of the present invention, more nitrogen may be introduced to an oxide at a lower plasma power. As such, lower energy nitrogen atoms/ions are produced by the plasma, and fewer nitrogen atoms/ions reach the silicon/silicon dioxide interface. A thinner nitrided oxide film may result. In some embodiments, residual oxygen may be scavenged by active nitrogen which results in lower levels of oxygen or moisture during nitridation of the substrate.

In addition, the present invention provides methods and apparatus for improving process repeatability. More specifically, deleterious inter-process memory effects that may occur between nitridation steps that employ different processing conditions (e.g., power) may be reduced or eliminated by the present invention.

Methods of the present invention include preconditioning an empty process chamber with an "aggressive plasma" prior to processing a substrate within the chamber. Application of such an aggressive plasma before each substrate is processed within the chamber may be referred to as Plasma between Every Substrate ("PES") or Plasma between Every Wafer ("PEW").

For convenience, the terms "aggressive plasma step" are employed herein to describe a step of employing an aggressive plasma within an "empty" chamber to pre-condition the chamber for a subsequent nitridation step to be performed on a substrate. An aggressive plasma may be characterized as a plasma created with a higher power (e.g., a higher radio frequency (RF) power), with a lower gas pressure (e.g., by the introduction of a second gas such as argon or helium), and/or for a longer time than that of the subsequent nitridation step.

An "empty" chamber used during an aggressive plasma step may include a chamber that does not contain a substrate or a chamber that contains a non-production or "dummy" substrate or similar object. The terms "substrate nitridation step" are employed herein to describe plasma nitridation or a similar process performed on a substrate.

As indicated above, the effects of preconditioning a process chamber with an aggressive plasma are that (1) subsequently performed substrate nitridation steps such as plasma nitridation may be more consistent in terms of repeatability (e.g., wafer to wafer repeatability); (2) the amount of nitrogen that is incorporated into a film ($N_{dose}$) in subsequent substrate nitridation steps may be increased for a given film thickness; and/or (3) thinner films may be created during subsequent substrate nitridation steps with more desirable (e.g., better) gate oxide characteristics.

Many different recipes for creating an aggressive plasma suitable to precondition a processing chamber according to the present invention may be employed. For example, in a 300 mm substrate processing chamber in which an $N_2$ plasma is used to nitridize thin oxide films to form oxy-nitride films for gate oxide applications, an effective recipe for a preconditioning plasma may include: an RF power of about 2000 Watts, a plasma gas pressure of about 20 milliTorr (mT), a preconditioning time of about 20 seconds, and an $N_2$ flow rate of about 200 standard cubic centimeters per minute (sccm). Note however, the power, pressure, time, and $N_2$ flow may be varied. For example, various combinations of RF powers ranging from about 800 W to 2500 W, pressures ranging from about 10 mT to 100 mT, times ranging from about 5 sec to 60 sec, and/or gas mixtures (e.g., He, Ar, N, etc.) may result in effective recipes for plasmas with different levels of aggressiveness. Other ranges may be used, and may vary, for example, with chamber and/or substrate size (e.g., such as for 200 mm substrates).

Using different levels of aggressive plasma during chamber preconditioning has been found to produce different concentrations and/or distributions of nitrogen during subsequent substrate nitridation steps and different memory effects between subsequent substrate nitridation steps. For example, by preconditioning between each substrate nitridation step with a plasma created with an RF power that is approximately 150% to 200% larger than the highest power to be used during substrate nitridation, any memory effect between substrate nitridation steps may be effectively eliminated. In a further example, the $N_{dose}$ in a subsequent substrate nitridation step generally increases as the aggressiveness of the preconditioning recipe is increased.

In some embodiments, the use of preconditioning with an aggressive plasma may cause nitrogen to be absorbed into or adsorbed onto process kit parts such as the lid, liners, the electrostatic chuck (which, e.g., may be made from anodized aluminum, quartz, etc.) and/or interior walls of a chamber. During subsequent substrate nitridation steps at a lower power, the nitrogen may be desorbed or released into the plasma resulting in a plasma richer in nitrogen which may lead to a higher $N_{dose}$ and formation of a thinner oxide film (e.g., as a lower energy plasma may be used). In other words, the chamber may have a characteristic equilibrium related to the amount of nitrogen that may be absorbed/adsorbed at different levels of plasma aggressiveness and at more aggressive levels, the chamber may absorb/adsorb more nitrogen that is later desorbed or released at lower levels of plasma aggressiveness. Additionally or alternatively, the aggressive plasma preconditioning step may saturate chamber surfaces and/or process kits parts with nitrogen so that such surfaces and/or process kits parts do not absorb or absorb less nitrogen during lower power plasma nitridation processes. Therefore, more nitrogen may be available for substrate nitridation.

In some embodiments, nitrogen released from process kit parts and chamber surfaces may effectively displace and/or reduce the relative partial pressure of any $O_2$ or $H_2O$ that has been trapped in the chamber from loading/unloading. In such embodiments, the absence of $O_2$ and moisture and/or the higher relative partial pressure of $N_2$ may result in less oxygen incorporation in the thin film (e.g., so as to form a thinner oxide layer).

In some embodiments, a first substrate nitridation step may alter a process chamber characteristic related to an amount of nitrogen that is present during a second substrate nitridation step. For example, if the first substrate nitridation step employs a higher power plasma relative to the second substrate nitridation step, the second substrate nitridation step may experience a memory effect resulting from more nitrogen being present during the second substrate nitridation step. The $N_{dose}$ in the oxide film thereby may be increased, and the oxide film thickness formed by the second substrate nitridation step may be increased (relative to what would occur without a memory effect) or remain the same. Alternatively, if the second substrate nitridation step employs a higher power plasma relative to the first substrate nitridation step, the second substrate nitridation step may experience a memory effect wherein less nitrogen is present during the second substrate nitridation step. The $N_{dose}$ in the oxide film thereby may be decreased, and the oxide film thickness formed by the second nitridation may be decreased (relative to what would occur without a memory effect) or remain the same. Thus, in some embodiments, the present invention may take advantage of the memory effect by preconditioning a chamber with a plasma that is at a substantially higher power (e.g., 200%) than the higher power of the first and second substrate nitridation steps.

In some embodiments, an aggressive plasma preconditioning step may be adapted such that the relative difference between the power levels of the first and second substrate nitridation steps is negligible compared to the relative difference between the power levels of the preconditioning step and either of the substrate nitridation steps. The overall result is that the memory effect on both nitridation steps from the preconditioning step is much larger than any inter-process memory effect (e.g., a memory effect on the second nitridation step from the first nitridation step) to such a degree that the second nitridation step may be performed without any detectable memory effect from the first nitridation step. Thus, methods of the present invention may be employed to improve the repeatability of sequences of nitridation steps that use different RF power levels.

To demonstrate the above-described memory effect, in one exemplary embodiment, a decoupled plasma nitridation (DPN) chamber available from Applied Materials, Inc. of Santa Clara, Calif. was employed to examine the memory effect between substrate nitridation steps. More specifically, wafers were nitrided within a DPN chamber as RF power was switched between a high level and a low level. Following nitridation, Ndose was measured.

FIG. 1 is a graph of Ndose versus wafer number (slot number) in a 300 mm DPN chamber for such an embodiment. Wafers were processed at a high power level of 500 Watts continuous wave at 20 mTorr chamber pressure for 32 seconds with an N2 flow rate of 200 sccm with no wafer chucking and at a low power level of 200 Watts continuous wave at 20 mTorr chamber pressure for 32 seconds with an N2 flow rate of 200 sccm with no wafer chucking. As shown by reference numeral 100, Ndose does not stabilize at a steady state (lower) value until after several substrates have been processed following a switch from high power to low power nitridation. Likewise, as shown by reference numeral 102, Ndose does not stabilize at a steady state (higher) value until after several substrates have been processed following a switch from low power to high power nitridation. Such results are believed to caused by the above-described memory effect.

Figure 2:
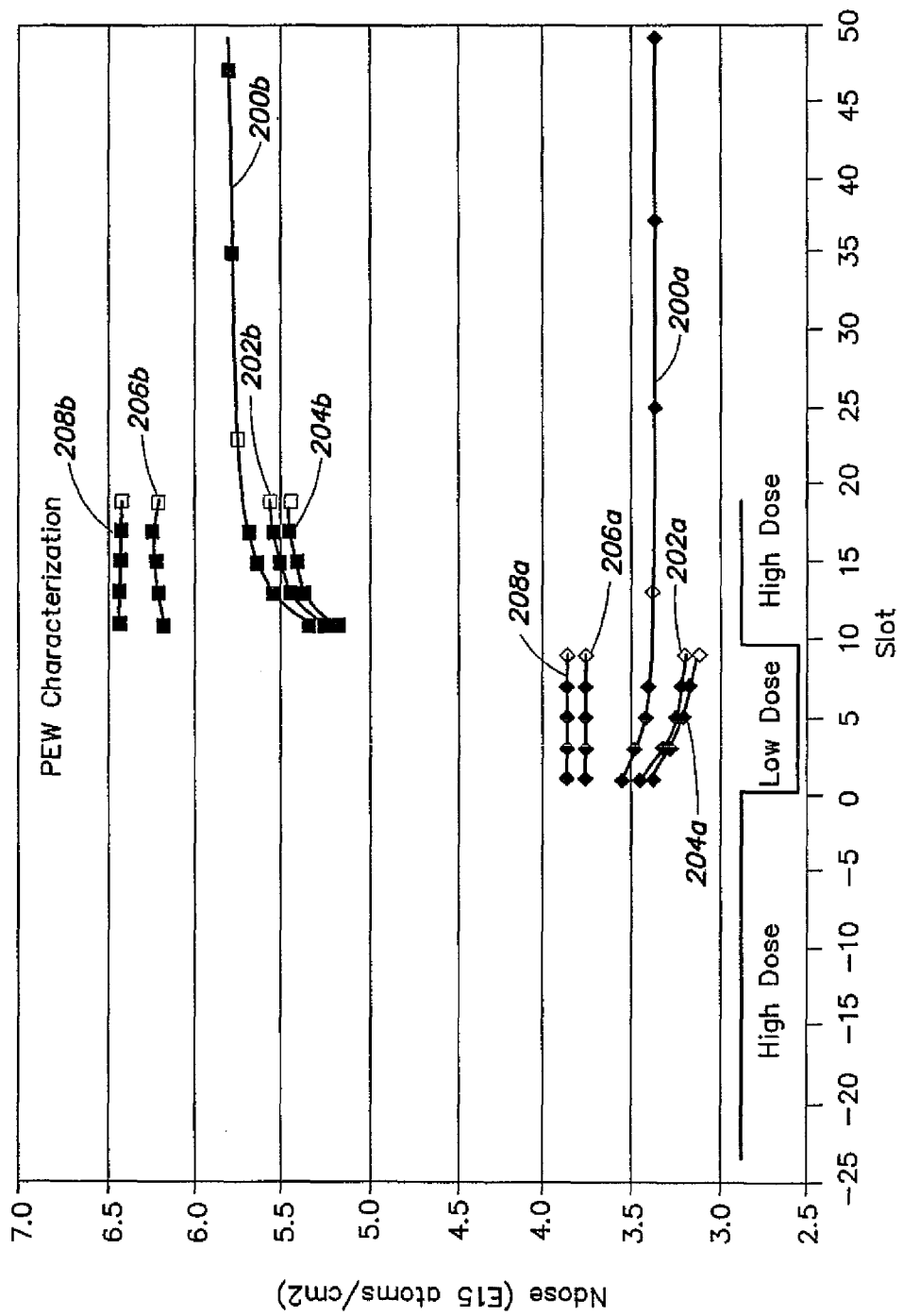
FIG. 2 is a graph of Ndose versus wafer number (slot number) in a 300 mm DPN chamber in which RF power is similarly switched between a high level and a low level in accordance with the present invention.

FIG. 2 is a graph of Ndose versus wafer number (slot number) in a 300 mm DPN chamber in which RF power is similarly switched between a high level and a low level. Specifically wafers are processed at a high power level of 500 Watts continuous wave at 20 mTorr chamber pressure for 32 seconds with an N2 flow rate of 200 sccm with no wafer chucking and at a low power level of 200 Watts continuous wave at 20 mTorr chamber pressure for 32 seconds with an N2 flow rate of 200 sccm with no wafer chucking. An aggressive plasma or "plasma every wafer" (PEW) is performed between each substrate. Five different PEW process conditions were employed as represented by curves 200*a-b*, 202*a-b*, 204*a-b*, 206*a-b* and 208*a-b*:

(1) No PEW as shown by curves 200*a-b*;
(2) Low power N2 PEW of 40 Watts continuous wave at 20 mTorr chamber pressure for 32 seconds with an N2 flow rate of 200 sccm as shown by curves 202*a-b*;
(3) High power Helium PEW of 2000 Watts continuous wave at 20 mTorr chamber pressure for 32 seconds with a He flow rate of 200 sccm as shown by curves 204*a-b*;
(4) High power N2 PEW of 1000 Watts continuous wave at 20 mTorr chamber pressure for 32 seconds with an N2 flow rate of 200 sccm as shown by curves 206*a-b*; and
(5) High power N2 PEW of 2000 Watts continuous wave at 20 mTorr chamber pressure for 32 seconds with an N2 flow rate of 200 sccm as shown by curves 208*a-b*.

As shown by curves 200*a-b*, 202*a-b* and 204*a-b*, lack of a PEW, use of a low power N2 PEW and use of a high power Helium PEW do not appear to mitigate the memory effect associated with a nitridation plasma chamber that is switched between high and low power processes. However, use of a high power N2 PEW (e.g., about 1000 Watts or higher in the above example), appears to significantly eliminate such memory effect as shown by curves 206*a-b* and 208*a-b*.

Figure 3:
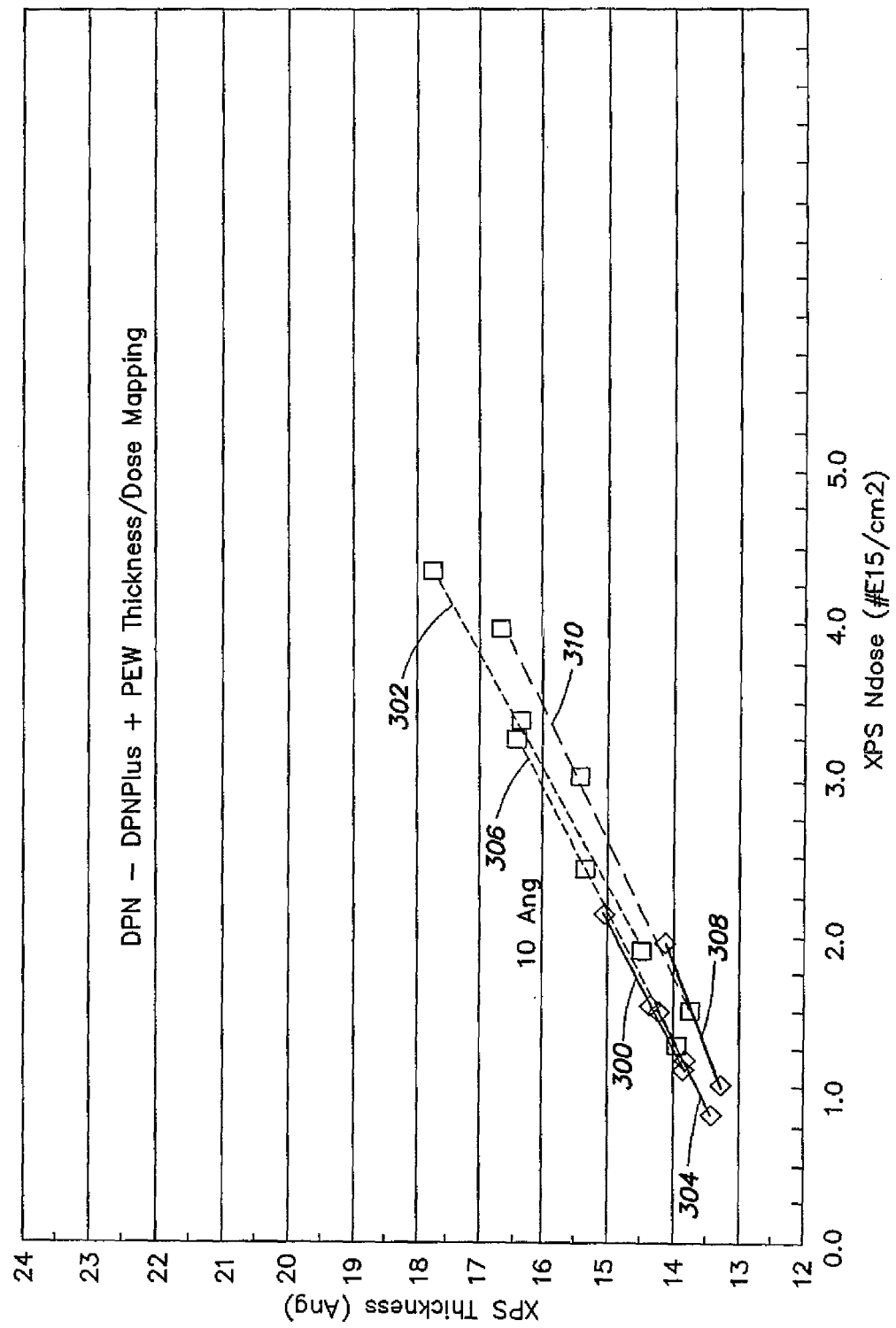
FIG. 3 illustrates thickness versus Ndose for substrates processed with and without various aggressive plasma steps and with a starting oxide thickness of about 10 angstroms in accordance with the present invention.

As stated above, use of an aggressive plasma prior to substrate nitridation may produce a thinner nitrided oxide for a given starting oxide thickness. FIG. 3 illustrates thickness versus Ndose for substrates processed with and without various PEW process steps and with a starting oxide thickness of about 10 angstroms. As shown in FIG. 3, use of PEW with a low pulsed or mid continuous wave RF power results in a thinner nitridized oxide thickness for a given starting oxide thickness as shown by curves 300, 302, 304, 306, 308 and 310 which represent:

(1) in curve 300, thickness versus Ndose following nitridation using a DPN chamber available from Applied Materials, Inc. of Santa Clara, Calif. with a low RF pulse power of 50 Weff, 75 Weff, and 100 Weff, a base oxide of 10 angstroms (rapid thermal oxide), a pulse of 5% Duty-Cycle and enhanced pulse radio frequency generation, a chamber pressure of 20 mT, N2 plasma for 30 s, no chucking, preset-hold, a post nitridation anneal, and a Divcap of 15%;

(2) in curve 302, thickness versus Ndose following nitridation using a DPN chamber available from Applied Materials, Inc. of Santa Clara, Calif. with a mid RF power of 100 W, 200 W, and 300 W, a base oxide of 10 angstroms (rapid thermal oxide), continuous wave, enhanced pulse radio frequency generation, a chamber pressure of 20 mT, N2 plasma for 30 s, no chucking, a post nitridation anneal, and Divcap of 15%;

(3) in curve 304, thickness versus Ndose following nitridation using a DPNplus chamber available from Applied Materials, Inc. of Santa Clara, Calif. with a low RF pulse power of 50 Weff, 75 Weff, and 100 Weff, a base oxide of 10 angstroms (rapid thermal oxide), a pulse of 5% Duty-Cycle and enhanced pulse radio frequency generation, a chamber pressure of 20 mT, N2 plasma for 30 s, no chucking, a post nitridation anneal, and a Divcap of 30%;

(4) in curve 306, thickness versus Ndose following nitridation using a DPNplus chamber available from Applied Materials, Inc. of Santa Clara, Calif. with a mid RF power of 100 W, 200 W, and 300 W, a base oxide of 10 angstroms (rapid thermal oxide), continuous wave, enhanced pulse radio frequency generation, a chamber pressure of 20 mT, N2 plasma for 30 s, no chucking, a post nitridation anneal, and Divcap of 50%;

(5) in curve 308, the same as (3) above preceded by an N2 PEW (2000 Watts continuous wave at 20 mTorr chamber pressure for 32 seconds with an N2 flow rate of 200 sccm); and (6) in curve 310, the same as (4) above preceded by an N2 PEW (2000 Watts continuous wave at 20 mTorr chamber pressure for 32 seconds with an N2 flow rate of 200 sccm).

As shown in FIG. 3, the use of PEW prior to nitridation may produce a thinner nitridized oxide for a given film thickness.

Figure 4:
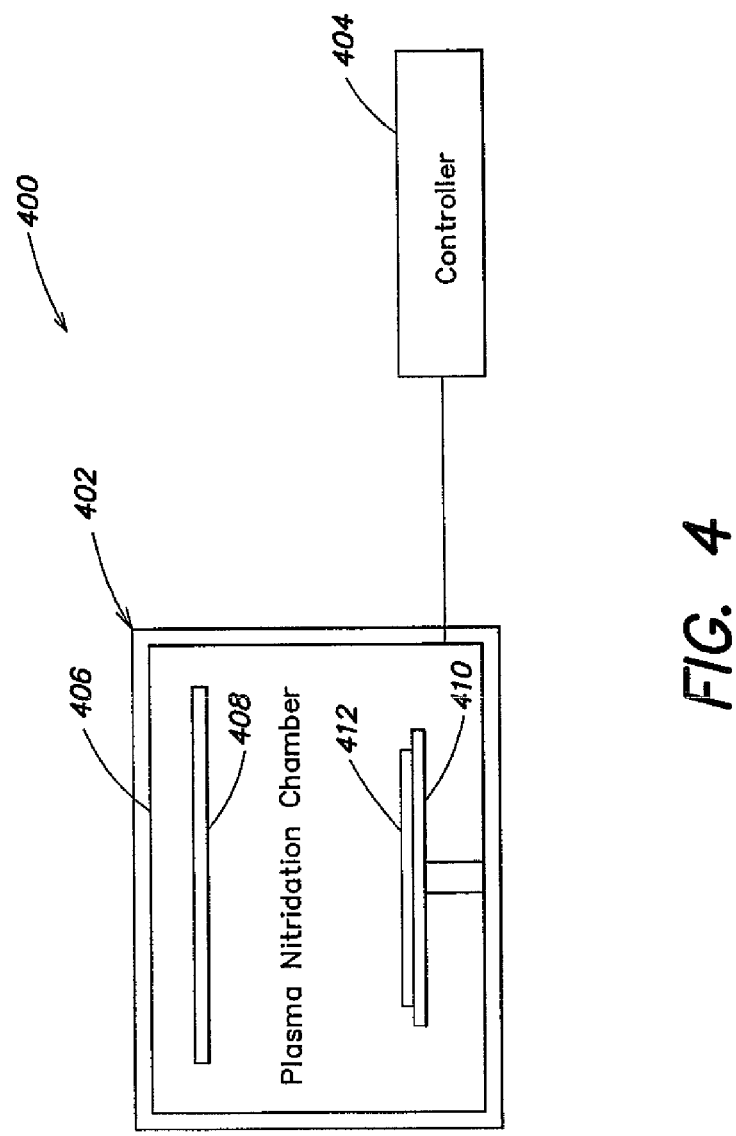
FIG. 4 is a schematic diagram of a plasma nitridation system provided in accordance with the present invention.

FIG. 4 is a schematic diagram of a plasma nitridation system 400 provided in accordance with the present invention. The plasma nitridation system 400 includes a plasma nitridation chamber 402 coupled to a controller 404 (e.g., via one or wires or cables, wirelessly, etc.).

The plasma nitridation chamber 402 may include any suitable plasma nitridation chamber, such as the 300 mm DPN Centura® system available from Applied Materials, Inc. of Santa Clara, Calif. The chamber 402 may include a chamber enclosure 406 adapted to surround process kit parts that include a first electrode 408 disposed above a susceptor 410 that supports a substrate 412 during processing. The chamber enclosure 402 includes various inlets and outlets (not shown) provided to flow process gases and/or coolants. The chamber may be referred to as a decoupled plasma nitridation (DPN) chamber, although the plasma employed need not be "decoupled".

The controller 404 may include one or more microprocessors, microcontrollers, dedicated hardware, a combination thereof, or the like. In at least one embodiment of the invention, the controller 404 is adapted (e.g., programmed) to perform an aggressive plasma process within the plasma nitridation chamber 402 before a substrate is loaded and nitrided in the plasma nitridation chamber 402. Such an aggressive plasma step may be performed before every substrate is processed (e.g., plasma every substrate) or after some other number of substrates have been processed within the chamber (e.g., 1, 2, 3, 4, etc.). The controller 404 also may be adapted to control other processes, such nitridation within the plasma nitridation chamber 402.

Figure 5:
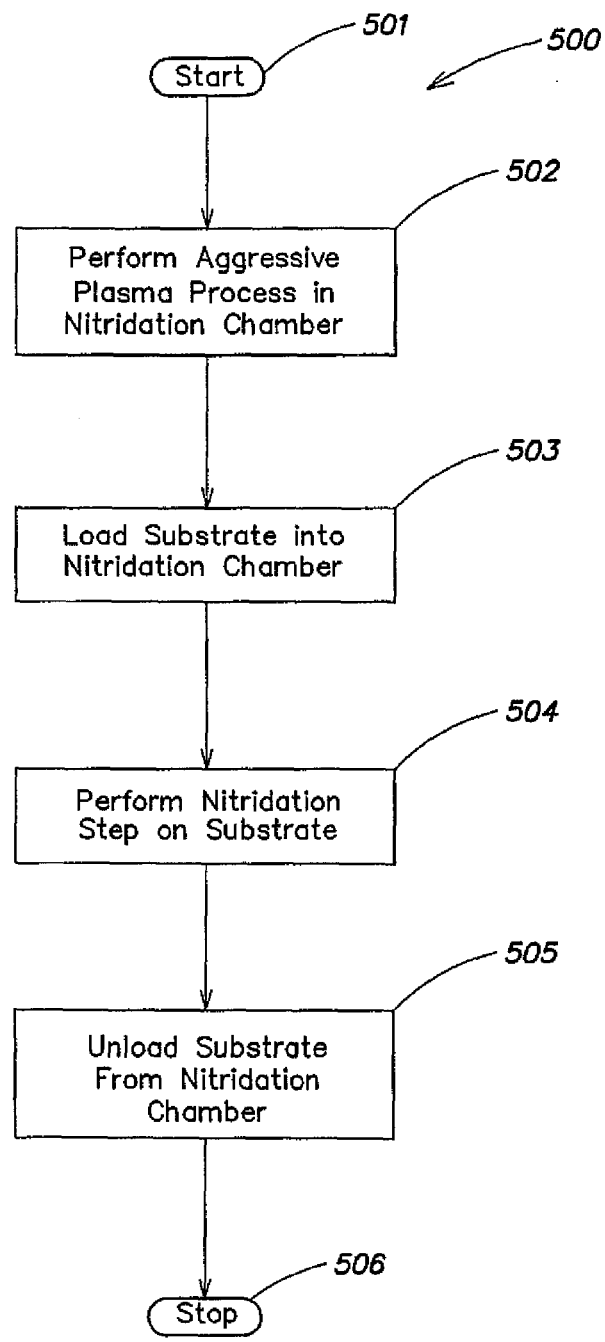
FIG. 5 is a flowchart of an exemplary method for nitridizing a substrate in accordance with the present invention.

FIG. 5 is a flowchart of an exemplary method 500 for nitriding a substrate in accordance with the present invention. With reference to FIG. 5, the method 500 begins at step 501. At step 502, an aggressive plasma step is performed within the plasma nitridation chamber 402. For example, in a 300 mm substrate processing chamber in which an $N_2$ plasma is used to nitridize thin oxide films to form oxy-nitride films for gate oxide applications, an effective recipe for a preconditioning plasma may include: an RF power of about 2000 Watts, a plasma gas pressure of about 20 milliTorr (mT), a preconditioning time of about 20 seconds, and a $N_2$ flow rate of about 200 standard cubic centimeters per minute (sccm). Note however, the power, pressure, time, and $N_2$ flow may be varied. For example, various combinations of RF powers ranging from about 800 W to 2500 W, pressures ranging from about 10 mT to 100 mT, times ranging from about 5 sec to 60 sec, and/or gas mixtures (e.g., He, Ar, N, etc.) may result in effective recipes for plasmas with different levels of aggressiveness. Other ranges may be used, and may vary, for example, with chamber and/or substrate size (e.g., such as for 200 mm substrates). The aggressive plasma process of step 502 may be performed while the chamber 402 is empty, or while a dummy substrate or similar object is present in the substrate.

Following step 502, a substrate is loaded into the plasma nitridation chamber 402. In step 503, a nitridation process is performed on the substrate within the plasma nitridation chamber 402. For example, any conventional plasma nitridation process may be employed (e.g., to form an oxynitride or another similar material layer).

In step 505, the substrate is unloaded from the nitridation chamber 402; and in step 506, the method 500 ends. Any suitable post-nitridation steps may be employed (e.g., post-nitridation anneal, other deposition or etch steps, etc.).

FIG. 6 is a timeline of a conventional nitridation process sequence 600 for a plasma nitridation chamber (not shown). With reference to FIG. 6, three nitridation processes, referred to as DPN, are performed between times T0-T1, T2-T3, and T4-T5, respectively, within the plasma nitridation chamber. Between nitridation processes, the plasma nitridation chamber idles, such as between times T1-T2 and T3-T4.

FIG. 7 is a timeline of a first exemplary nitridation process sequence 700 for a plasma nitridation chamber (not shown) provided in accordance with the present invention. The sequence 700 of FIG. 7 is similar to the sequence 600 of FIG. 6, but includes an aggressive plasma step (referred to as PEW in FIG. 7) between each nitridation process step. Specifically, between times T0-T1 a nitridation process is performed on a first substrate in a plasma nitridation chamber. Between time T1-T2, the plasma nitridation chamber idles. Between times T2-T3, an aggressive plasma process is performed in the plasma nitridation chamber. Between times T3-T4, a nitridation process is performed on a second substrate in the plasma nitridation chamber. Between times T4-T5, the plasma nitridation chamber idles. Between times T5-T6, an aggressive plasma process is performed in the plasma nitridation chamber. Between times T6-T7, a nitridation process is performed on a third substrate in the plasma nitridation chamber. As stated above, use of an aggressive plasma prior to each nitridation process significantly reduces any memory effects associated with a plasma nitridation chamber, and may produce a thinner nitrided oxide.

FIG. 8 is a timeline of a second exemplary nitridation process sequence 800 for a plasma nitridation chamber (not shown) provided in accordance with the present invention. The sequence 800 of FIG. 8 is similar to the sequence 700 of FIG. 7, with the exception that each idle time is reduced to accommodate each aggressive plasma step. In this manner, system throughput is not reduced by the aggressive plasma steps.

Aggressive plasma (or PEW/PES) steps may be interspersed between each nitridation step according to some embodiments of the present invention. Note that in other embodiments, one or more aggressive plasma steps may be performed immediately after a substrate nitridation step, immediately before a substrate nitridation step or at any time therebetween. Likewise, more than one aggressive plasma step may be performed between each nitridation step, or an aggressive plasma step may be performed less frequently (e.g., after every 2, 3, 4, etc., substrates). From a throughput standpoint, it may be desirable to perform an aggressive plasma step during chamber idle (as shown in FIG. 8).

A nitridation process preceded by aggressive plasma conditioning (PEW) results in the same or minimally thicker oxide layer with a higher $N_{dose}$ than the oxide layer formed using the plasma nitridation process without aggressive plasma conditioning. Note that because of the higher $N_{dose}$, a lower power plasma may be employed to produce a thinner oxide layer having the same $N_{dose}$ as a plasma nitridation process that is not preceded by aggressive plasma conditioning.

The foregoing description discloses only exemplary embodiments of the invention. Modifications of the above disclosed apparatus and methods which fall within the scope of the invention will be readily apparent to those of ordinary skill in the art. For instance, the present invention may be employed to improve the nitridation process of oxides as well as other films (e.g., high K films such as HfSiOx, HfO2, zirconium oxide, tantalum oxide, rare-earth metal oxides & silicates and other metal oxides and silicates such as HfO2, HfSiO, ZrO2, ZrSiO, Ta2O5, La3O3, LaSiO, Gd2O3, GdSiO, Y2O3, YSiO, Al2O3, AlSiO, Pr2O3, PrSiO and combinations thereof such as HfAlO, LaAlO, YAlO or the like, etc., stacked films such as nitride/oxide stacks, etc.). For example, an aggressive plasma preconditioning step may be employed prior to plasma nitridation of a high K film, or prior to formation of a thermal or plasma deposited nitride that includes a plasma deposited oxide overlayer. In certain embodiments, a single chamber may be used for performing silicon nitride deposition, oxide deposition and plasma nitridation of the nitride/oxide stack (with or without a preconditioning, aggressive plasma step).

During plasma nitridation, additional nitrogen may be flowed into a plasma chamber to increase nitridation uniformity and/or decrease film thickness (e.g., by diluting oxygen/moisture levels within the chamber). Additional/alternative nitrogen sources may include molecular nitrogen, atomic nitrogen (e.g., from a remote plasma source), dilute nitrogen (e.g., diluted in helium, argon, etc., such as about 20% nitrogen in a carrier gas), NO, NH$_3$, N$_2$O, etc. Such additional/alternative nitrogen sources also may be flowed during aggressive plasma preconditioning (as described above). Inductively coupled, capacitively coupled or other plasma sources may be employed during preconditioning and nitridation.

As stated, an aggressive plasma or PES/PEW recipe may be aggressive enough to significantly reduce and/or eliminate memory effects within a plasma nitridation chamber. For example, in some embodiments, depending on the oxide and other factors, about 200% RF power in a DPN process may provide the highest Ndose for PEW to address any possible memory effect within a process window.

Target Ndose is increased by PEW, with an amount that depends on the aggressiveness of PEW recipe. In some embodiments, only a few dummy runs produce a good Ndose baseline, regardless of preceding conditions. Ndose may shift from baseline, and a nitridation process may need to be re-centered. However, a stable N dose may be achieved with PEW for large process windows. Maintaining the same queue time between PEW and the next wafer to be processed may improve wafer to wafer uniformity.

Additional or alternative chamber preconditioning methods may be used. For example, a waferless plasma that simulates cycling wafers prior to processing a lot may be used (e.g., when switching between lots with different processes). Further, a waferless plasma that runs prior to processing a lot may be employed, with process conditions selected to reduce recovery time. Such a "plasma on go" process may be implemented, for example, when switching between lots with different processes. Other preconditioning techniques include coating process kit parts with alternate materials, heating process kit components, upgrading and/or modifying components, improving closed loop control, etc.

An aggressive plasma may be employed at any time. For example, immediately before a nitridation process, immediately after a nitridation process, with a "plasma on go" process, with a controlled idle time (e.g., about 1 minute), before or after a "plasma during idle" process, for a short duration, etc.

In at least one embodiment, a nitridation process may be chosen that gives the highest Ndose within the process window, and the RF power and/or time changed if needed. Exemplary PEW recipe times include 45 seconds, 60 seconds, 120 seconds, etc.

Accordingly, while the present invention has been disclosed in connection with exemplary embodiments thereof, it should be understood that other embodiments may fall within the spirit and scope of the invention, as defined by the following claim.

The invention claimed is:

1. A method comprising:
    preconditioning a process chamber with a plasma;
    loading a substrate into the process chamber; and
    performing plasma nitridation on the substrate within the process chamber;
    wherein the process chamber is preconditioned using a plasma power that is at least 150% higher than a plasma power used during plasma nitridation of the substrate.

2. The method of claim 1 wherein preconditioning the process chamber with a plasma comprises employing a plasma power of about 800 to 2500 watts.

3. The method of claim 1 wherein preconditioning the process chamber with a plasma comprises preconditioning the process chamber for about 5 to 60 seconds.

4. The method of claim 1 wherein preconditioning the process chamber with a plasma comprises employing a chamber pressure of about 10 to 100 milliTorr.

5. The method of claim 1 wherein preconditioning the process chamber with a plasma comprises preconditioning the process chamber with a nitrogen plasma.

6. The method of claim 5 wherein preconditioning the process chamber with a nitrogen plasma comprises preconditioning the process chamber with a gas mixture that includes nitrogen and at least one of helium and argon.

7. The method of claim 5 wherein preconditioning the process chamber with a nitrogen plasma comprises causing nitrogen to be absorbed or adsorbed onto at least one of process kit parts and chamber walls of the process chamber.

8. The method of claim 7 wherein preconditioning the process chamber with a nitrogen plasma comprises saturating at least one of process kit parts and chamber walls of the process chamber with nitrogen.

9. The method of claim 1 wherein preconditioning the process chamber with a plasma comprises reducing a relative partial pressure of at least one of oxygen and water in the process chamber.

10. The method of claim 1 further comprising employing the plasma preconditioning step to reduce variation between sequences of nitridation steps that employ different power levels.

11. The method of claim 1 wherein preconditioning the process chamber is performed immediately before performing plasma nitridation on the substrate.

12. The method of claim 1 wherein preconditioning the process chamber is performed during an idle time of the process chamber.

13. The method of claim 1 wherein the process chamber is preconditioned using a plasma power that is at least 200% higher than a plasma power used during plasma nitridation of the substrate.

14. The method of claim 1 further comprising preconditioning the process chamber with a plasma before each substrate processed within the process chamber.

15. The method of claim 1 wherein performing plasma nitridation on the substrate comprises nitriding an oxide layer of the substrate.

16. The method of claim 15 wherein the oxide layer comprises silicon dioxide.

17. The method of claim 15 wherein the oxide layer comprises a high K film.

18. A method comprising:
preconditioning a process chamber with a first nitrogen plasma;
loading a first substrate into the process chamber;
performing plasma nitridation on the first substrate, wherein the process chamber is preconditioned with the first nitrogen plasma using a plasma power that is at least 150% higher than a plasma power used during plasma nitridation of the first substrate;
preconditioning the process chamber with a second nitrogen plasma;
loading a second substrate into the process chamber; and
performing plasma nitridation on the second substrate, wherein the process chamber is preconditioned with the second nitrogen plasma using a plasma power that is at least 150% higher than a plasma power used during plasma nitridation of the second substrate.

19. The method of claim 18 wherein preconditioning the process chamber with the first and second plasmas comprises employing a plasma power of about 800 to 2500 watts.

20. The method of claim 18 wherein preconditioning the process chamber with the first and second plasmas comprises preconditioning the process chamber for about 5 to 60 seconds.

21. The method of claim 18 wherein preconditioning the process chamber with the first and second plasmas comprises employing a chamber pressure of about 10 to 100 milliTorr.

22. A method comprising:
preconditioning a process chamber with a plasma so as to cause nitrogen to be absorbed or adsorbed onto at least one of process kit parts and chamber walls of the process chamber;
loading a substrate into the process chamber; and
performing plasma nitridation on the substrate within the process chamber.

23. The method of claim 22 wherein preconditioning the process chamber with a nitrogen plasma comprises saturating at least one of process kit parts and chamber walls of the process chamber with nitrogen.

24. The method of claim 22 further comprising employing the plasma preconditioning step to reduce variation between sequences of nitridation steps that employ different power levels.

* * * * *